US008411878B2

(12) United States Patent
Adam

(10) Patent No.: US 8,411,878 B2
(45) Date of Patent: Apr. 2, 2013

(54) LANDSCAPE SPEAKER CONNECTOR AND SOUND SYSTEM

(76) Inventor: Ron R. Adam, Alpine, CA (US)

( * ) Notice: Subject to any disclaimer, the term of this patent is extended or adjusted under 35 U.S.C. 154(b) by 1361 days.

(21) Appl. No.: 12/049,141

(22) Filed: Mar. 14, 2008

(65) Prior Publication Data

US 2008/0240468 A1 Oct. 2, 2008

Related U.S. Application Data

(60) Provisional application No. 60/908,900, filed on Mar. 29, 2007.

(51) Int. Cl.
*H03F 99/00* (2009.01)

(52) U.S. Cl. ........................................ 381/120; 439/411

(58) Field of Classification Search .................. 381/120; 439/411

See application file for complete search history.

(56) References Cited

U.S. PATENT DOCUMENTS

| | | | | |
|---|---|---|---|---|
| 2,469,986 | A * | 5/1949 | Phyfe | 381/78 |
| 2,629,780 | A * | 2/1953 | Byrd et al. | 381/78 |
| 3,162,726 | A * | 12/1964 | Rosenberg et al. | 381/78 |
| 4,004,095 | A * | 1/1977 | Cardone | 381/19 |
| 4,013,841 | A * | 3/1977 | Ohkubo et al. | 381/5 |
| 4,247,952 | A * | 1/1981 | Shibuya | 455/186.1 |
| 4,390,749 | A * | 6/1983 | Pearson | 381/10 |
| 4,449,238 | A * | 5/1984 | Lee et al. | 381/110 |
| 6,057,659 | A * | 5/2000 | Akiyama et al. | 381/98 |
| 6,111,965 | A * | 8/2000 | Lubbe et al. | 381/94.5 |
| 6,298,866 | B1 * | 10/2001 | Molnar, IV | 135/16 |
| 6,707,405 | B2 * | 3/2004 | Kuttner | 341/141 |
| 2003/0194101 | A1 * | 10/2003 | Sexauer et al. | 381/120 |
| 2006/0126860 | A1 * | 6/2006 | Sievers et al. | 381/77 |
| 2006/0126867 | A1 * | 6/2006 | Walden | 381/119 |

* cited by examiner

*Primary Examiner* — Robert J Hoffberg
*Assistant Examiner* — Igwe U Anya
(74) *Attorney, Agent, or Firm* — Richard D. Clarke

(57) ABSTRACT

This application relates to an outdoor music and sound system. More particularly, this system incorporates unique weatherproof wing nut cable connectors used in connecting a plurality of weatherproof speakers on a single electrical line to a remote sound system that may be employed in a variety of landscape areas. By using 8 ohm, at 20 to 50 watt resistor units, or a 1.5 to 2 ohm receiver amplifier, to control the output, a single cable can be used to connect to a plurality of speakers. Two or more cables may be connected to the electronics unit. This inexpensive system can easily be sold at discount hardware stores in conjunction with the wide variety of inexpensive outdoor lighting systems now available.

15 Claims, 5 Drawing Sheets

LANDSCAPE SPEAKER CONNECTOR AND SOUND SYSTEM

This non-provisional patent application claims the benefit of U.S. provisional patent application Ser. No. 60/908,900 filed on Mar. 29, 2007.

FIELD OF THE INVENTION

This application relates to an outdoor music and sound system. More particularly, this landscape speaker connector and sound system incorporates a unique weatherproof wing nut cable connector used in connecting a plurality of weatherproof speakers on a single electrical line to a remote sound system that may be employed in a variety of landscape areas.

BACKGROUND OF THE INVENTION

Landscaping around a patio, a flowerbed, a deck, a pool or a building can enhance the appearance of those features and draw attention to them. It can also generally provide for a serene and relaxing environment. Landscaping can encompass many things, such as, the addition of a lighting scheme, a stone or brick wall, fencing, a water fountain, flowers, trees, shrubs, or a sound system.

Landscape speakers are commonplace and well known, but recently speakers have been developed that do not have the paper cones, instead they have a complete plastic structure that is waterproof. Indeed, the use of such landscape speakers in an outdoor environment has grown in popularity as outdoor spaces are increasingly used as an extension of living space. For both functional and decorative purposes, outdoor landscape speakers are designed to appear as rocks, planters, pedestals, furniture and even animals, that blend into landscaping. Often, such outdoor landscape speakers are placed along pathways, driveways, sidewalks, patios, plant beds, pools and spas.

Outdoor sound systems typically comprise a plurality of strategically located speakers connected by individual speaker wires, one wire to each speaker in the stereo system. Typically, the speaker wires are run under the eaves of the house or other structure or are buried in the ground in such a manner that each outdoor speaker is electrically connected to the speaker output of the stereo system.

Home and business landscaping is a popular project and pastime with home and business owners. They often hire a landscaping company to do an expensive design and implement a plan to enhance the land surrounding a home or building. These systems are often too complicated for private individuals to work on themselves. Instead of contracting a landscaping company, homeowners and business owners can do the work themselves but the problems arise when the products available are not dependable.

Although there has been a substantial increase in the types of outdoor sound systems in light of strong consumer demand for such systems, the current sound systems available today contain a number of features that limit their utility and market acceptance. What is needed is a fully integrated and flexible outdoor sound system that permits the uses of common elements to reduce the costs of installation and a reduction of the lengths of wires linking each speaker back to the stereo system, along with the capability of increasing the number of speakers.

Numerous innovations for a landscape speaker system have been provided in the prior art that are described as follows. Even though these innovations may be suitable for the specific individual purposes to which they address, they differ from the present application as hereinafter contrasted. The following is a summary of those prior art patents most relevant to the landscape speaker system at hand, as well a description outlining the difference between the features of the present design and those of the prior art.

U.S. Pat. No. 6,580,361 of Charles E. Butcher describes an integrated outdoor lighting and sound systems comprising a plurality of outdoor landscaping lighting units, a wiring cable interconnecting the plurality of outdoor landscaping lighting units, a source of low-voltage energy connected to said wiring cable and a plurality of speaker assemblies, each of the speaker assemblies including a speaker, an audio amplifier for amplifying sound to the speaker, the audio amplifier further including leads connected to the wiring cable for supplying electrical power to the audio amplifier, and a battery storage electrically connected to the wiring cable for storing electrical energy and for supplying the electrical energy to the audio amplifier.

This patent describes an integrated outdoor lighting and sound system that is very involved. These systems usually require an electrician to install them and a permit, due to the fact of the large amount of electrical wiring involved. They are generally expensive and cannot easily be sold at a discount hardware store.

U.S. Patent Publication No. 2006/0126860 of Leon R. Sievers discloses an audio output device that is configured to transmit an audio signal to an external power amplifier. The transmission of the audio signal can be accomplished by means of a wireless transmitter or standard audio cable. The power amplifier, a low voltage power supply, and in certain embodiments a wireless receiver are commonly housed in a weatherproof enclosure. In one embodiment of the invention, the amplified audio signal and low-voltage power provided by the low voltage power supply are transmitted by means of a common cable to a lighting and sound unit.

This patent describes another lighting and sound configuration that is very involved and does not have the benefits derived by using the unique wing nut cable connectors disclosed in this application.

U.S. Pat. No. 7,066,613 of Tejaswi Vishwamitra tells of a sound and light apparatus including a lamp and a speaker. The sound and light apparatus can be used indoors or outdoors to enhance a landscape plan or an interior design plan. Multiple sound and light apparatuses can be used to further enhance the ambiance of an indoor or outdoor location.

This patent describes a specific sound and light apparatus, but is not incorporating the electronic sound system.

U.S. Pat. No. 3,679,845 of Giovanni Geloso describes a light unit incorporating, above, a sound distribution unit separate from the lamp and protected by an upper cap designated to also form the sound box of the aforementioned sound distribution system. The elements are assembled in such a way as to permit easy access to the sound distribution system independently of the lamp.

This patent describes lighting combined with a sound distribution system in such a way as to achieve simultaneously the combined effects of lighting and broadcasting music and/or announcements. It has been designed primarily for commercial applications.

U.S. Pat. No. 6,345,685 of Leigh D. Wells discloses a loudspeaker system for providing a self-contained light and sound system for entertainment. The loudspeaker system includes a loudspeaker system comprised of a housing unit attached to a cage comprising of a plurality of rods and two rim members by means of a plurality of fasteners attached to the top rim member. There is a tubular enclosure inside of the cage which is at least part transparent to varying degrees of opacity, sandwiched between the bottom rim member and the housing unit with countersunk gaskets to seal the tubular enclosure. The bottom rim member has mounted into it a loudspeaker driver and legs to elevate the loudspeaker system. When the unit is detached from the top rim member of the cage the transparent tubular enclosure is released. The housing unit contains a light emitting source, additional speakers and other associated electrical components. There are detachable audio and electrical connections between the housing unit and cage. The light created in the housing unit passes through a lens at the bottom of the housing unit into the tubular enclosure where a deflector/diffuser is situated at the rear of the loudspeaker driver deflecting the light onto and through the tubular enclosure walls.

This patent describes another loudspeaker system incorporating speakers but generally directed towards commercial applications. It describes a specific sound and light apparatus, but does not deal with the electronic sound system.

U.S. Pat. No. 6,769,509 of Ronald Paul Harwood describes a speaker assembly that is provided for enclosure within a structural pole. The speaker assembly includes a sub-plate adapted to be affixed, adjacent to an internal cavity formed in a fixed end of the structural pole. A speaker is mounted to the sub-plate and oriented such that acoustical vibrations provided by the speaker are directed toward an underlying support surface of the structural pole. A resonating chamber member is oriented within the structural pole internal cavity and has an open end mounted adjacent to the speaker. The resonating chamber member is sized to match the speaker This patent describes a speaker pole. It describes a specific sound and light apparatus, but does not deal with the electronic sound system.

None of these previous efforts, however, provides the benefits attendant with the present landscape speaker system. The present design achieves its intended purposes, objects and advantages over the prior art devices through a new, useful and unobvious combination of method steps and component elements, with the use of a minimum number of functioning parts, at a reasonable cost to manufacture, by employing readily available materials.

In this respect, before explaining at least one embodiment of the landscape speaker system in detail it is to be understood that this system is not limited in its application to the details of construction and to the arrangement, of the components set forth in the following description or illustrated in the drawings. The landscape speaker system is capable of other embodiments and of being practiced and carried out in various ways. In addition, it is to be understood that the phraseology and terminology employed herein are for the purpose of description and should not be regarded as limiting. As such, those skilled in the art will appreciate that the conception, upon which this disclosure is based, may readily be utilized as a basis for designing of other structures, methods and systems for carrying out the several purposes of the present design. It is important, therefore, that the claims be regarded as including such equivalent construction insofar as they do not depart from the spirit and scope of the present application.

SUMMARY OF THE INVENTION

The principal advantage of the landscape speaker system is that it offers a simplified system that can legally be installed by a homeowner without requiring a permit.

Another advantage is that the landscape speaker system has the capability of connecting a plurality of speakers on a single electrical cable.

Another advantage is that the landscape speaker system provides two or more electrical cables with a plurality of speakers on each line.

Another advantage is that the landscape speaker system does not have to use separate wires for each speaker.

Another advantage is that the landscape speaker system employs a unique weatherproof wing nut style of electrical cable connectors.

Another advantage is that the landscape speaker system does not incorporate a lighting system that increases the complications in manufacturing and installation along with the costs.

Another advantage is that the landscape speaker system may be sold at a reasonable price.

Another advantage is that the landscape speaker system includes a wing nut cable connector that can be used for all types of low-voltage applications including lighting systems.

A further advantage is that the landscape speaker system can be sold in segments and added to later on.

And yet a further advantage of this landscape speaker system is to add a new, unique and economical device to the area of both commercial and residential landscaping.

These together with other advantages of the landscape speaker system, along with the various features of novelty, which characterize this system, are pointed out with particularity in the claims annexed to and forming a part of this disclosure. For a better understanding of this system, its operating advantages and the specific objects attained by its uses, reference should be made to the accompanying drawings and descriptive matter in which there are illustrated preferred embodiments of this application. There has thus been outlined, rather broadly, the more important features of the landscape speaker system in order that the detailed description thereof that follows may be better understood, and in order that the present contribution to the art may be better appreciated. There are additional features of this system that will be described hereinafter and which will form the subject matter of the claims appended hereto.

In operation of the landscape speaker system, the user installs the receiver amplifier and couples the receiver amplifier to a power source. The receiver amplifier is stored in a secure area, inside or outside the house, protected from damage and the weather. Furthermore, the user couples a 14 AWG direct burial cable to the audio output of the receiver amplifier. The direct burial cable is displaced throughout the landscaped area, above ground or underground, hidden from view. The user stakes into the ground a variety of waterproof outdoor speakers and couples the speakers to the direct burial cable by using a wing nut cable edge connector, a wing nut cable side connector and/or other types of cable connectors. The wing nut connectors attach to the direct burial cable coupling a plurality of speakers to the receiver amplifier, thereby providing power and an audio source to the speakers. The speakers may be displaced anywhere, preferably ten to fifteen feet apart, to produce a uniform distribution of sound throughout the landscaped area.

The wing nut cable connectors cannot only quick lock onto any cable wire without damaging the insulation, but can also unlock from any cable without the use of tools and/or additional wiring equipment. Thereby, allowing the user to connect and disconnect the landscape speaker whenever he/she so pleases, quick and easily without the need for professional audio installation experts. Advantageously, the ability to use the wing nut cable connector allows any user, even a novice user, to install the landscape speaker system professionally and easily. Furthermore, the use of a wing nut cable connector allows the user to connect and disconnect the wing nut cable connector multiple times throughout the cable wire without damaging the insulation protecting the cable wire, and without the need of wiring tools and/or equipment.

In addition, the figures illustrate a 14 AWG direct burial line, however one skilled in the art may appreciate that the direct burial cable may be, but not limited to, landscape wires, speaker wires, and/or cable wire. Furthermore, the burial line may also vary in gauge sizes, examples are but not limited to 10, 12, 14 and 16 gauge wiring.

The receiver amplifier may be located anywhere on the user's property and still perform its intended function and may include a built in charger for iPods and/or MP3 players, and/or head phone attachments. The receiver amplifier as illustrated in the figures is a 200-Watt stereo amplifier; however one skilled in the art may appreciate that the amplifier may be of stronger power. A 200-Watt receiver amplifier may supply up to 16 speakers compared to only 8 speakers from the 100 Watt monaural receiver amplifier. Examples of a receiver amplifier may be such as, but not limited to a 100-Watt or 200-Watt, single channel or dual channel receiver amplifier. The amplifier is connected to the speakers through a resistor unit of 8 ohms, at 20 to 50 watts.

Other types of amplifier receivers are also contemplated. For example, a receiver amplifier could be designed specifically for a landscape speaker sound system. This receiver amplifier would have a 1.5 to 2 ohms impedance, which would eliminate the requirement for resistor units. The resistors unit(s) purpose is to correct the impedance on an 8 ohms receiver amplifier. Therefore, a receiver amplifier having an impedance of 1.5 to 2 ohms could be employed, and no resistor units would be necessary within that contemplated configuration of components.

Furthermore, it is also contemplated that other sound sources, such as computers, CD players, MP3 players and satellite radio receivers could be employed which would transmit a signal (via FM or 900 MHz, etc.) to the receiver amplifier, enabling, for example, a user to play MP3s from their computer via a 900 MHz signal.

Additionally, although the figures illustrate a stake type waterproof sound speaker, one skilled in the art may appreciate that the waterproof sound speaker may be any type of waterproof sound speaker and still perform its intended function. Examples are but not limited to: stand type speaker, rock type speaker, light and speaker combination, or a box type to be mounted in the eaves of a structure. This inexpensive system can easily be sold at discount hardware stores in conjunction with the existing wide variety of inexpensive outdoor lighting systems now available.

It is expected that there could be numerous variations of the design of this invention. An example is that the sound system may be a portable or a permanent fixture within the landscaped area. Finally, it is envisioned that the components of the device may be constructed of a variety of materials, such as: metals, metal alloy, plastic, rubber, and/or aluminum.

With respect to the above description then, it is to be realized that the optimum dimensional relationships for the parts of the landscape speaker system, to include variations in size, materials, shape, form, function and manner of operation, assembly and use, are deemed readily apparent and obvious to one skilled in the art. All equivalent relationships to those illustrated in the drawings and described in the specification are intended to encompass the present design. Therefore, the foregoing is considered as illustrative only of the principles of the landscape speaker system. Further, since numerous modifications and changes will readily occur to those skilled in the art, it is not desired to limit this system to the exact construction and operation shown and described, and accordingly, all suitable modifications and equivalents may be resorted to, falling within the scope of this application.

DESCRIPTION OF THE DRAWINGS

The accompanying drawings, which are incorporated in and form a part of this specification, illustrate embodiments of the landscape speaker system and together with the description, serve to explain the principles of this application.

For a fuller understanding of the nature and advantages of the landscape speaker system, reference should be had to the following detailed description taken in conjunction with the accompanying drawings which are incorporated in and form a part of this specification, illustrate embodiments of the invention and together with the description, serve to explain the principles of this application.

DETAILED DESCRIPTION OF THE PREFERRED EMBODIMENTS

Figures 1, 2:
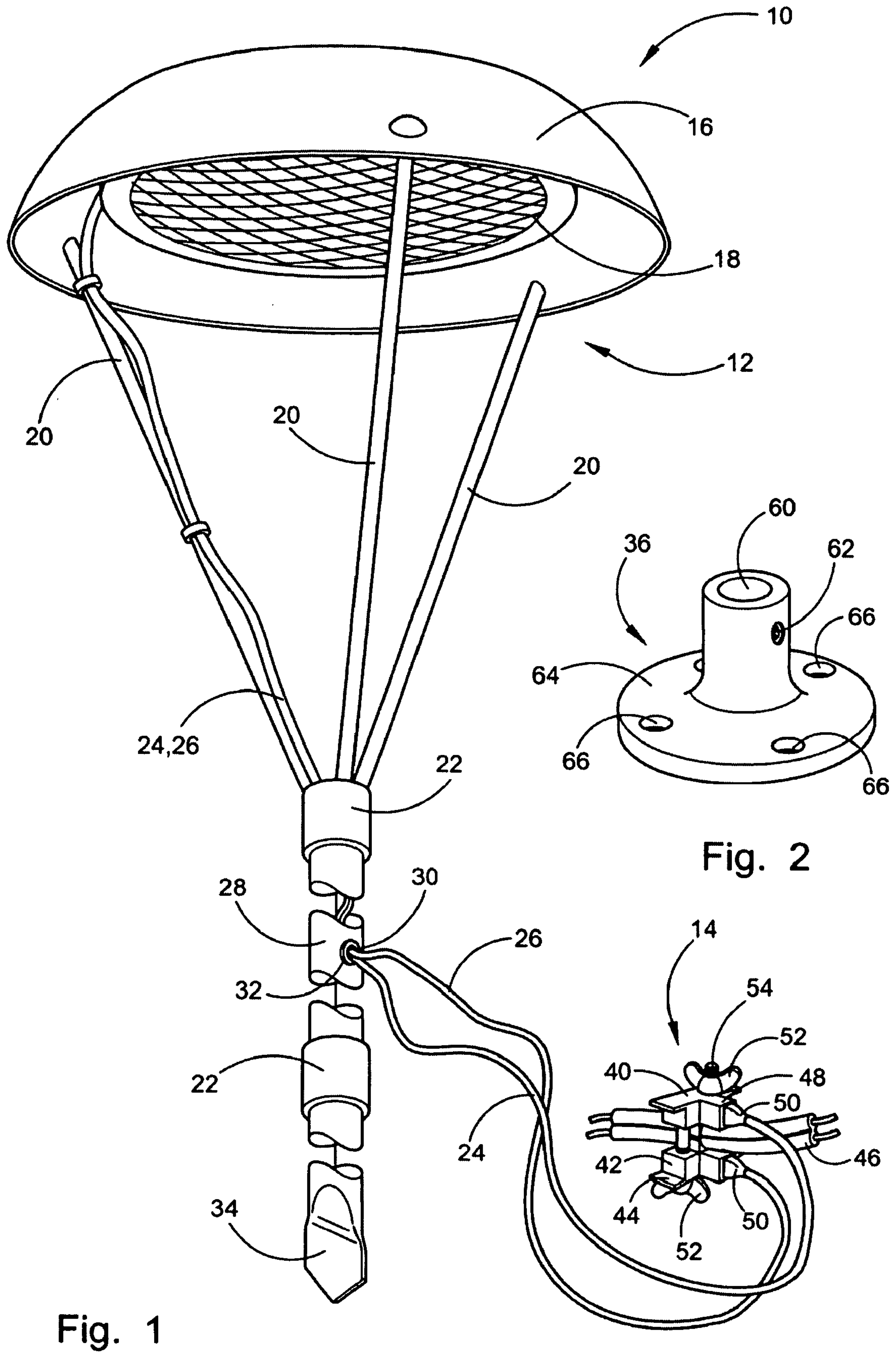
FIG. 1 depicts a perspective view of a single speaker and wing nut cable connector, constructed in accordance with the present invention.
FIG. 2 depicts a perspective view of an optional floor flange, mounting unit, constructed in accordance with the present invention.

Referring now to the drawings, wherein similar parts of the landscape speaker system 10 are identified by like reference numerals, there is seen in FIG. 1, a perspective view of the preferred embodiment of a single speaker unit 12 and wing nut cable edge connector 14. The preferred embodiment of the single speaker unit 12 will consist of a dome cover 16 inclosing a waterproof speaker 18 with three tubular support rods 20 extending to a coupler 22. The electrical connection is made by the means of a pair of connecting speaker wires 24 and 26, which are attached to one of the tubular support rods 20 or may be run through the center of one or more of the tubular support rods 20. The speaker wires 24 and 26 extend down through the coupler 22 into the central support tube 28 to exit through a wire insulator 30 in an orifice 32. At the distal end of the central support tube 28 is located a second coupler 22 to enable the insertion of a stake section 34 or for mounting of the floor flange 36 shown in FIG. 2.

FIG. 1 additionally illustrates an assembled wing nut cable edge connector 14 consisting of an upper body section 40 and a lower body section 42 that are typical, only reversed in direction. A tab 44 extends from either side of the body sections 40 and 42 to aide in pressing the two parts together over the main cable 46. An insulating box section 48 extends out to the side of each of the body sections 40 and 42 to insert the conventional blade type electrical connector end 50. Wing nuts 52 screw down on the threaded stud sections 54 of the upper and lower body sections 40 and 42.

FIG. 2 depicts a perspective view of an optional floor flange 36, mounting unit that will hold the lower coupler 22 on the central support tube 28 of the single speaker unit 12. The lower coupler 22 will fit into the orifice 60, to be tightened in place by the means of a setscrew 62. The flat base plate 64 can be mounted on a flat surface by the means of attachments through mounting orifices 66.

Figure 3:
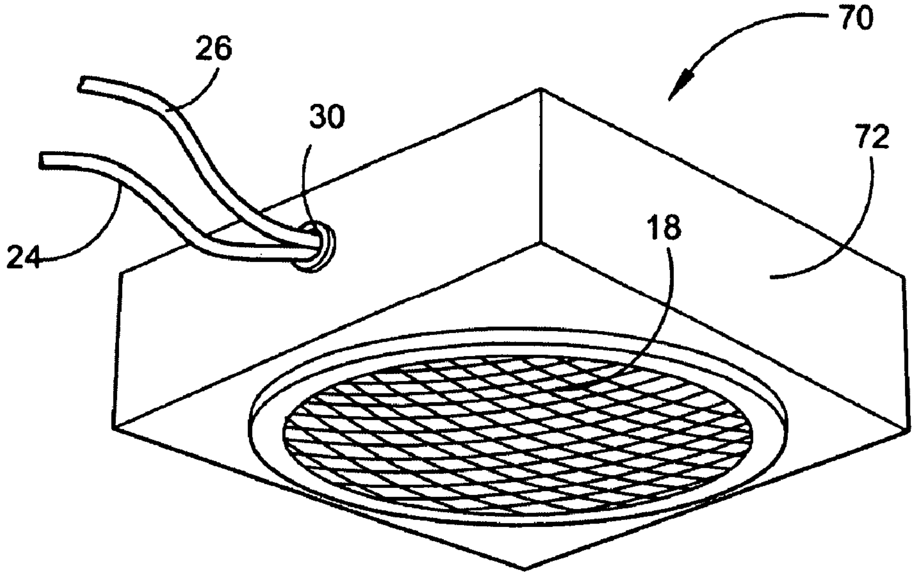
FIG. 3 depicts a perspective view of an optional square box horizontal mounting speaker, constructed in accordance with the present invention.

FIG. 3 depicts a perspective view of an optional horizontal mounting speaker 70 with the waterproof speaker 18 housed in a square speaker box 72. It must be understood that a wide variety of configurations for the waterproof speaker 18 housings may be contemplated, and will fall within the scope of this application. These housings will have speaker wires 24 and 25 extending through wire insulators 30.

Figure 4:
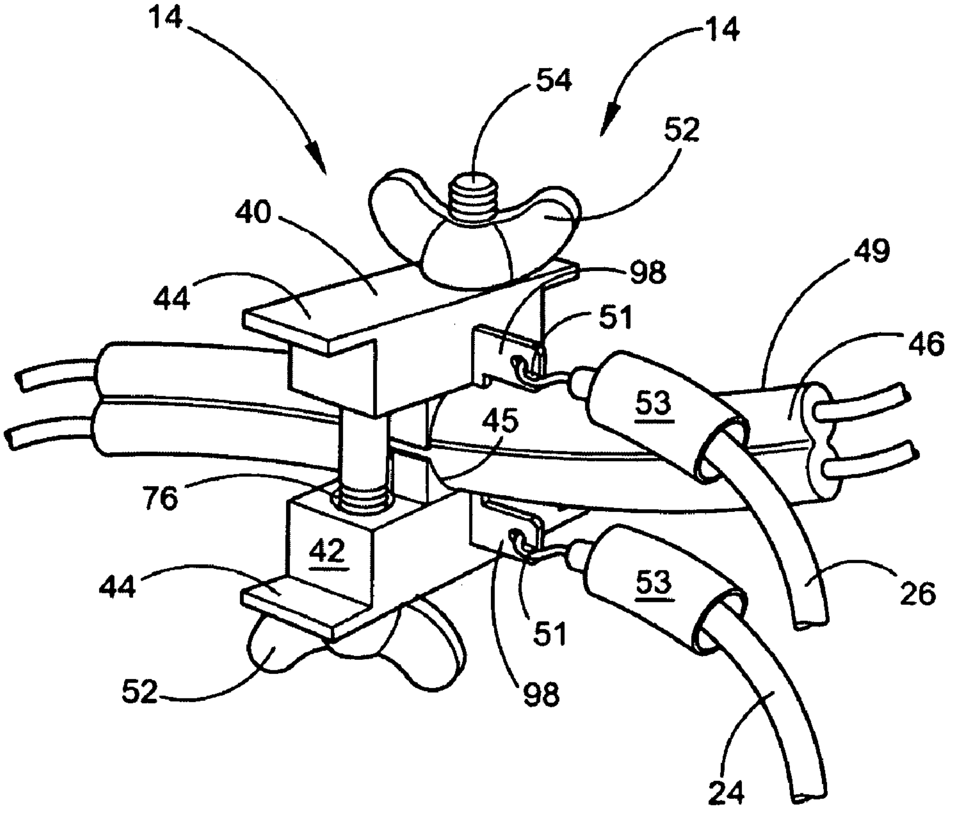
FIG. 4 depicts a perspective view of a partially assembled wing nut cable edge connector made for soldering and shrink tubing the wire connection, constructed in accordance with the present invention.

FIG. 4 depicts an enlarged perspective view of another embodiment of the partially assembled wing nut cable edge connector 14, consisting of an upper body section 40 and a lower body section 42 that are typical, only reversed in direction. A tab 44 extends form either side of the body sections 40 and 42 to aide in pressing the two parts together over the main cable 46. A saddle area 45 is contoured to conform to the cable edge 49 of the main cable 46. In this embodiment there are no insulating box sections extending out to the side of each of the body sections 40 and 42 used for insertion of conventional blade type electrical connector ends. Rather, the electrical blade ends 98 are exposed, and speaker wires 24 and 26 are stripped to expose bare wire 51, then these bare wires are soldered to the electrical blade ends 98. To secure and protect the soldered connection, shrink tubing 53 is used.

Figure 5:
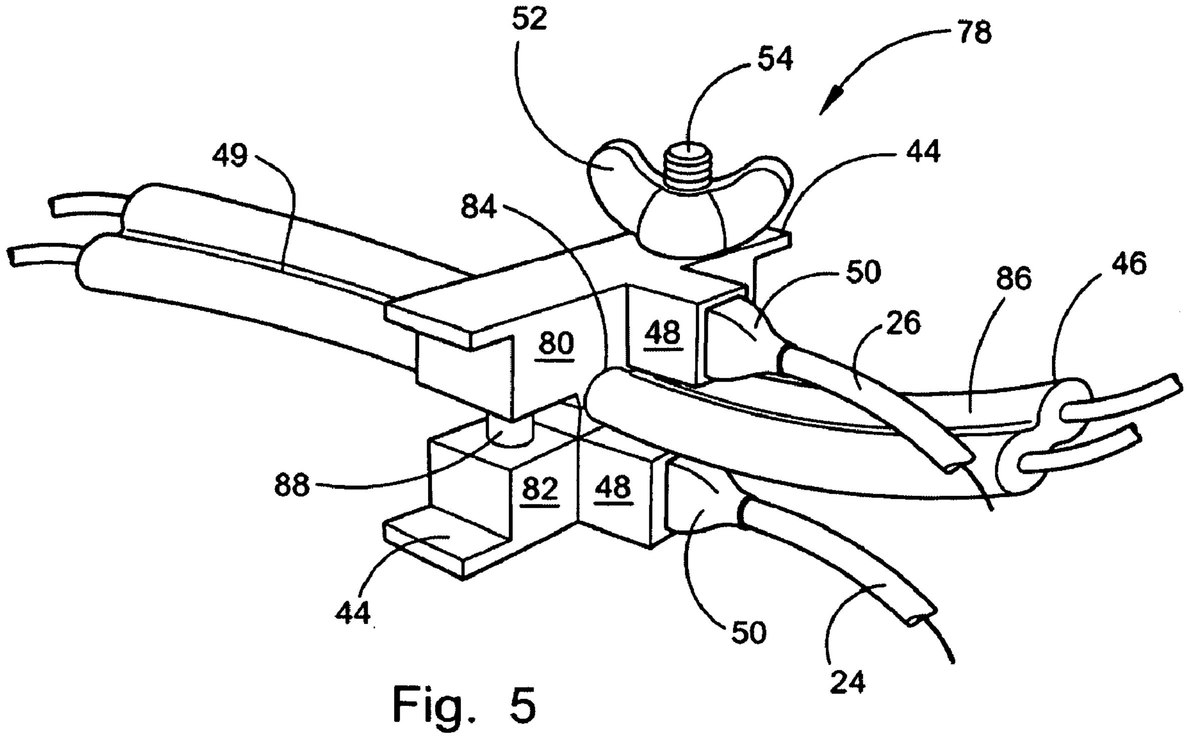
FIG. 5 depicts a perspective view of an assembled wing nut cable side connector, constructed in accordance with the present invention.

As in the previous embodiment, best seen in FIGS. 1 and 5, wing nuts 52 screw down on the threaded stud section 54 of the upper and lower body sections 40 and 42. A countersunk orifice 76 on the opposite side of the wing nut upper and lower sections 40 and 42 from the threaded stud 54 allows for easy penetration when the parts are mated together. The wing nut connector 14 has enough force to squeeze down on the insulated wire, to an airtight fit, which maintains good continuity. Additionally, if continuity is ever lost, a couple more turns of the wing nut 52 would be all that is needed to re-gain continuity. Because of the wing nut construction, the present connector exerts great force and is much less likely to loosen than other, prior art connectors.

FIG. 5 depicts a perspective view of an assembled wing nut cable side connector 78 consisting of an upper body section 80 and a lower body section 82. A pair of tabs 44 extend outward from both sides of the body sections 80 and 82 to aide in pressing the two parts together over the main cable 46. A saddle area 84 is contoured to conform to the side 86 of the main cable 46. An insulating box section 48 extends out to the side of each of the body sections 80 and 82 to insert the conventional blade type electrical connector end 50. Wing nut 52 screw down on the threaded stud section 54 of the lower section 82. A single wing nut 52 is used on the wing nut cable side connector 78 with a dowel pin 88 used on the opposite side.

Figure 6:
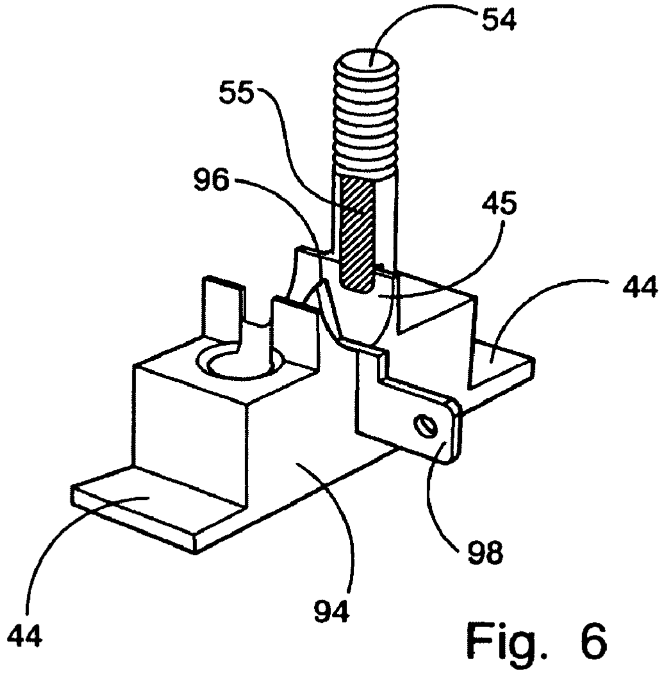
FIG. 6 depicts a perspective view of one side of the edge mount wing nut connector with the optional exposed electrical blade, constructed in accordance with the present invention.

FIG. 6 depicts a perspective view of one side of the wing nut cable edge connector 94 with the electrical blade insert 96 exposed for commercial purposes where the blade end 98 is exposed for the purpose of a push on or solder connection. FIG. 6 also shows the flattened portion 55 of threaded stud 54 (described in greater detail below).

Figure 7:
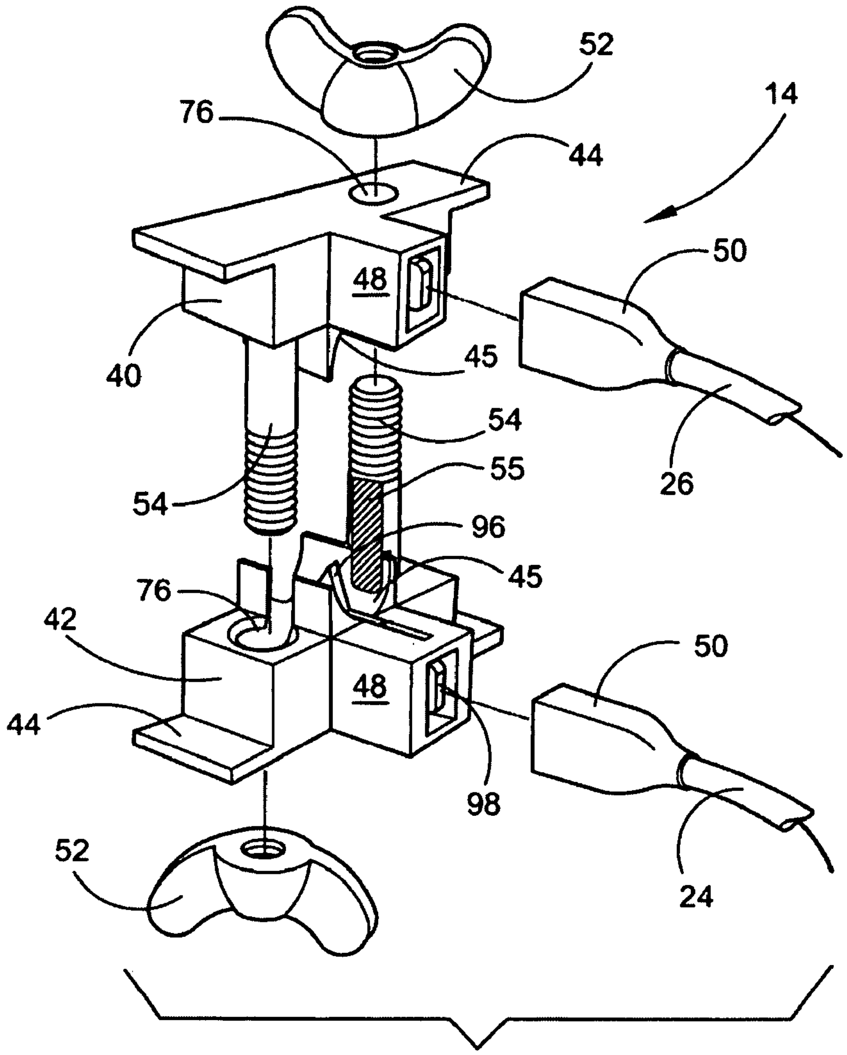
FIG. 7 depicts an exploded perspective view of an assembled edge mount wing nut cable connector illustrating the individual parts, constructed in accordance with the present invention.

FIG. 7 depicts an exploded perspective view of an assembled wing nut cable edge connector 14 illustrating the individual parts. This figure more clearly shows the threaded stud 54, and the partially flattened portion 55 of said threaded stud 54. This partially flattened portion 55 of the threaded stud 54 allows for proper secure seating of the main cable 46 (not shown here), and prevents resistance and chaffing when the connector is tightened down to secure the main cable 46, as best seen in FIG. 4.

Figure 8:
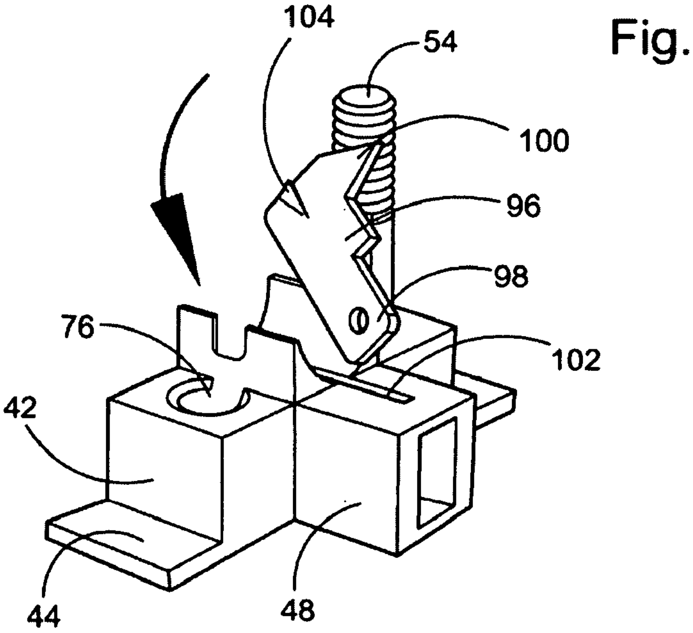
FIG. 8 depicts a perspective view of one side of an edge mount wing nut cable connector illustrating the assembly method of installing the electrical blade connector with sharp prong, constructed in accordance with the present invention.

FIG. 8 depicts a perspective view of one side of a wing nut cable edge connector 14 illustrating the assembly method of installing the electrical blade connector 96 with sharp prong 100 having the electrical blade end 98 tilted to be inserted into the slot 102 in the wing nut cable edge connector lower section 42. The side of the electrical blade insert will be deformed to form a barb 104 to lock the electrical blade connector 96 into the slot 102. When in position and the upper and lower sections 40 and 42 are tightened together, the sharp prong 100 will penetrate the cable edge surface 49 of the main cable 46.

Figure 9:
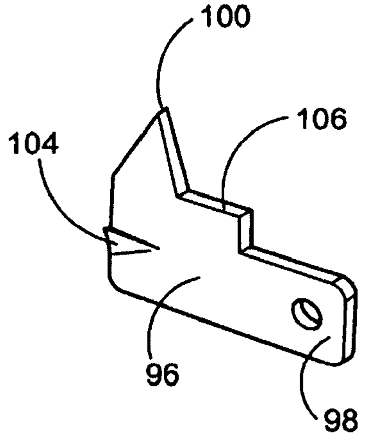
FIG. 9 depicts a perspective view of the electrical blade insert, constructed in accordance with the present invention.

FIG. 9 depicts a perspective view of the electrical blade insert 96 illustrating the barb 104 on the side, the sharp prong 100, the blade end 98 and a shoulder 106 to be used as a surface to press on when inserting the blade insert 96 into position within the slot 102. The sharp prong 100 would readily penetrate the direct burial cable wire insulation and make contact with the wire inside to create continuity within the system.

Figure 10:
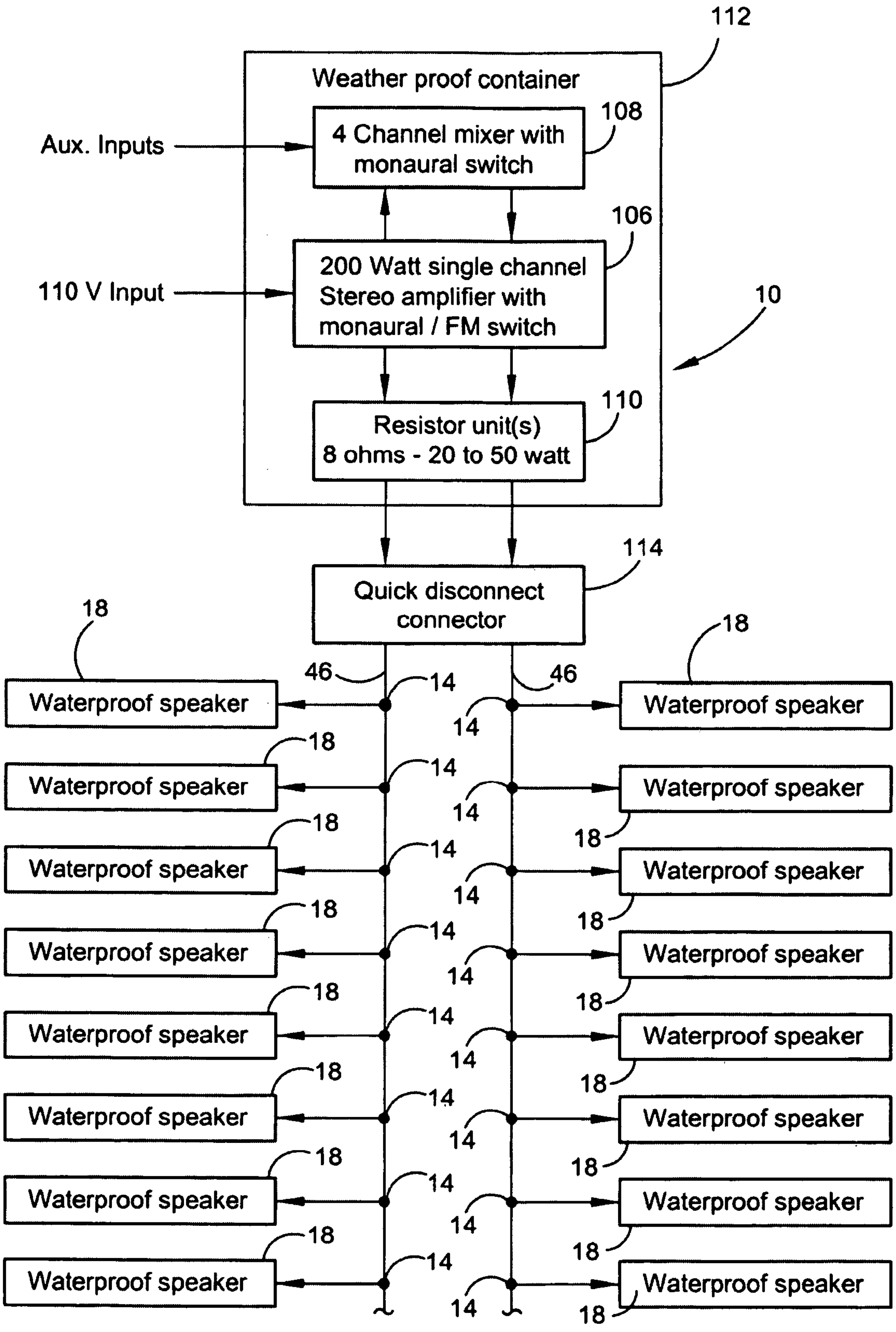
FIG. 10 depicts a block diagram of the basic landscape speaker sound system, constructed in accordance with the present invention.

FIG. 10 depicts a block diagram of the basic landscape speaker system 10 with a 200 watt single channel stereo amplifier with monaural/FM switch 106 coupled to a 4 channel mixer with a monaural switch 108 and one or more 8 ohm at 20 to 50 watts resister unit(s) 110 (note that one resistor unit would be required for each bank of 8 speakers). Here, in FIG. 10, we show a 16 speaker system, and this would require two resistor units. These electronic components will be housed in a weather tight container 112. The system shown here in FIG. 10 connects to 16 speaker units 18. A 200 watt stereo amplifier is required to run the 16 speakers. If 8 speakers were to make up the system, then a 100 watt monaural amplifier could be employed, and only one resistor unit would be required. The main cables 46 will be equipped with quick disconnect connectors 114 before connecting to the speaker units 18 by the means of wing nut cable connectors 14 or 78. Moreover, one skilled in the art could create or obtain a mono or stereo receiver amplifier with 1.5 to 2 ohms impedance, so no resistor unit would be necessary.

The landscape speaker system 10 shown in the drawings and described in detail herein disclose arrangements of elements of particular construction and configuration for illustrating preferred embodiments of structure and method of operation of the present system. It is to be understood, however, that elements of different construction and configuration and other arrangements thereof, other than those illustrated and described may be employed for providing a landscape speaker connector and sound system 10 in accordance with the spirit of this application, and such changes, alternations and modifications as would occur to those skilled in the art are considered to be within the scope of this system as broadly defined in the appended claims.

Further, the purpose of the foregoing abstract is to enable the U.S. Patent and Trademark Office and the public generally, and especially the scientists, engineers, and practitioners in the art who are not familiar with patent or legal terms or phraseology, to determine quickly from a cursory inspection, the nature and essence of the technical disclosure of the application. The abstract is neither intended to define the landscape speaker connector and sound system of this application, which is measured by the claims, nor is it intended to be limiting as to the scope of the design in any way.

I claim:

1. A landscape speaker sound system comprising:

(a) one or more landscape speakers, wherein each of said one or more landscape speakers are located in a protective housing;

(b) a receiver amplifier;

(c) a resistor unit coupled to said receiver amplifier;

(d) a direct burial cable coupling the receiver amplifier to said one or more landscape speakers; and (e) a quick lock cable connector for creating a connection between wires wherein said quick lock cable connector for creating a connection between a direct burial cable and speaker wires further comprises:

(i) an upper section and a lower section having partially threaded rods integral to said upper and lower sections and extending outward there from;

(ii) wing nuts for threading onto and securing the quick lock cable connector to a wire, such that when said wing nuts are tightened, said upper and lower sections are forced together into close proximity;

(iii) said upper and lower sections having a saddle area with a slot centrally located within said saddle area for accepting an electrical blade insert therein;

(iv) an electrical blade insert having an electrical blade end for connecting to speaker wire, a barb, and a sharp prong for penetrating direct burial cable wire; and (v) an insulating box section integral to said upper and lower section;

whereby said quick lock cable connector for creating a connection between wires enables readily connecting said one or more landscape speakers to said direct burial cable.

2. The landscape speaker sound system according to claim 1, wherein said one or more landscape speakers are waterproof speakers, and said housing is configured to further protect said one or more landscape speakers from the elements.

3. The landscape speaker sound system according to claim 1, wherein said receiver amplifier further includes about a 200 watt stereo amplifier for use with 8 to 16 landscape speakers.

4. The landscape speaker sound system according to claim 1, wherein said receiver amplifier further includes about a 100 watt monaural amplifier for use with 1 to 8 landscape speakers.

5. The landscape speaker sound system according to claim 1, wherein said receiver amplifier and said resistor unit coupled to said receiver amplifier are further coupled to a 4 channel mixer with a monaural switch, and the combination of said receiver amplifier and said resistor unit coupled to said receiver amplifier further coupled to a 4 channel mixer with a monaural switch, are all housed in a weatherproof container.

6. The landscape speaker sound system according to claim 1, wherein said resistor unit includes a resistor unit of 8 ohms about 20 to about 50 watts.

7. The landscape speaker sound system according to claim 1, wherein said direct burial cable is a double wire comprised of about 10 to about 16 gauge wire size.

8. The landscape speaker sound system according to claim 1, wherein said quick lock cable connector for creating a connection between wires connects the direct burial cable to speaker wires using a female blade type electrical connector end attached to the speaker wire, which is pushed on to said exposed male electrical blade end to connect said speaker wire.

9. The landscape speaker sound system according to claim 1, wherein said quick lock cable connector for creating a connection between said direct burial cable and said speaker wires, does not include an insulating box section integral to said upper and lower section, and uses a soldered connection between said exposed electrical blade end and said speaker wire.

10. The landscape speaker sound system according to claim 1, wherein said quick lock cable connector for creating a connection between said direct burial cable and said speaker wires, does not include an insulating box section integral to said upper and lower section, thereby leaving said electrical blade end exposed, and uses a female blade type electrical connector which is pushed on to said exposed male electrical blade end to connect said speaker wire.

11. The electrical connector for use in low voltage applications according to claim 10, wherein said upper section and lower section having partially threaded rods integral to said upper and lower sections, on opposite sides, and extending outward there from, comprises only said lower section having a partially threaded rod, with said upper section having a dowel pin whereby only one wing nut is used to tighten the connector and said dowel pin acts to prevent lateral movement.

12. The electrical connector for use in low voltage applications according to claim 10, wherein said insulating box section integral to said upper and lower section is absent, and said male electrical blade end is left exposed to be connected to using a push on female electrical blade type connector.

13. The electrical connector for use in low voltage applications according to claim 10, wherein said wherein said insulating box section integral to said upper and lower section is absent, and said male electrical blade end is left exposed to be connected to using a soldered connection, whereby said speaker wires are stripped and directly soldered to said exposed electrical blade end.

14. The electrical connector for use in low voltage applications according to claim 13, wherein said soldered connection between said electrical blade end and said stripped speaker wires is protected using shrink tubing.

15. An electrical connector for use in connecting wires in low voltage applications comprising:

(a) an upper section and a lower section having partially threaded rods integral to said upper and lower sections, on opposite sides, and extending outward there from;

(b) wing nuts for threading onto and securing the quick lock cable connector to a wire, such that when said wing nuts are tightened, said upper and lower sections are forced together into close proximity;

(c) said upper and lower sections having a saddle area with a slot centrally located within said saddle area for accepting an electrical blade insert therein;

(d) an electrical blade insert having an electrical blade end for connecting to speaker wire, a barb, and a sharp prong for penetrating direct burial cable wire; and (e) an insulating box section integral to said upper and lower section;

whereby when a direct burial cable is placed into said connector and said wing nuts are threaded down onto said threaded rods, the downward and upward force of the upper and lower sections closing causes the sharp prong of the electrical blade insert to penetrate and thereby connect to the direct burial cable, and enabling connection of speaker wires to the exposed electrical blade end located within the insulating box section of the upper and lower section.

* * * * *